(12) United States Patent
Bartilson

(10) Patent No.: US 6,172,874 B1
(45) Date of Patent: Jan. 9, 2001

(54) SYSTEM FOR STACKING OF INTEGRATED CIRCUIT PACKAGES

(75) Inventor: Bradley W. Bartilson, Houston, TX (US)

(73) Assignee: Silicon Graphics, Inc., Mountain View, CA (US)

( * ) Notice: Under 35 U.S.C. 154(b), the term of this patent shall be extended for 0 days.

(21) Appl. No.: 09/055,677

(22) Filed: Apr. 6, 1998

(51) Int. Cl.$^7$ ........................................................ H05K 7/20
(52) U.S. Cl. .................... 361/719; 257/686; 361/716; 361/735; 361/749
(58) Field of Search ........................... 257/686; 200/307; 439/69, 74, 67; 361/704, 707, 715, 716, 717–719, 729, 735, 744, 749, 784, 785, 788, 789, 790

(56) References Cited

U.S. PATENT DOCUMENTS

| | | | |
|---|---|---|---|
| 5,018,005 | * | 5/1991 | Lin . |
| 5,041,903 | * | 8/1991 | Millerick . |
| 5,103,375 | * | 4/1992 | Cottingham . |
| 5,561,593 | * | 10/1996 | Rotolante . |
| 5,790,380 | * | 8/1998 | Frankeny . |
| 5,861,666 | * | 1/1999 | Bellaar . |

* cited by examiner

Primary Examiner—Gerald Tolin

(74) Attorney, Agent, or Firm—Schwegman, Lundberg, Woessner & Kluth, P.A.

(57) ABSTRACT

An apparatus for electrically connecting a plurality chips to a circuit board includes a pair of ceramic chip carriers that have flexible circuits connected to the electrical contact locations on each ceramic chip. The apparatus for electrically connecting a plurality chips to a circuit board may also include an area between two chip connect surfaces which has multiple metallization layers isolated from one another by flexible isolation material. A flexible circuit extends beyond the edge of the ceramic chip or the chip-connect area and forms a flap. The flexible circuit flap includes electrical paths to pads on the chip-connect area of the device. Each flap portion of the flexible circuit has a set of pads. The pads on the flaps of the first and second ceramic chips are positioned to connect to a third set of pads on a printed circuit board. The printed circuit board is provided with pads positioned so that the pads on the flaps will correspond to the pads on the flaps of the ceramic chips. The circuit board is positioned near the edge of the first ceramic substrate and the second ceramic substrate so that the flaps of the first and second flexible circuit contact the third set of pads on said circuit board. The first and second ceramic chips having flexible circuit flaps or the device with the metallized layers isolated by flexible nonconductive material, can be stacked on one another to provide a very densely packaged unit. If cooling is a concern, thermally conducting surfaces can also be stacked with the devices. The thermally conductive surfaces can be heat pipes or surface treatments on the flat surface of the chip which conduct heat away from the components.

10 Claims, 9 Drawing Sheets

SYSTEM FOR STACKING OF INTEGRATED CIRCUIT PACKAGES

FIELD OF THE INVENTION

The present invention relates to a method and apparatus for packaging electrical components and more specifically to making electrical contacts to the pads on individual "superflex" modules which can be stacked vertically.

BACKGROUND OF THE INVENTION

High speed electronic digital computers of the type produced by Cray Research, Inc., the assignee hereof, typically require short length electrical connections between various electrical cards and chips. Timing problems between electrical signals can result from electrical signals passing through different conductor path lengths. Shorter length electrical connections introduce fewer timing problems between signals within the high speed digital computer. The shorter path lengths also provide better electrical performance when compared to longer path length conductors.

The trend in electronic packaging for a long time now has been to pack more electronics, such as transistors, onto a single substrate. Some microprocessors, for example, include 10,000,000 transistors in a 1.5 inch square substrate. Now what used to fit on multiple chips can be made to fit on a single substrate. However, yields limit the maximum size of an integrated circuit (IC). In other words, yields generally drop drastically at some point when making a large die. At the drastic yield dropping point, the cost per part skyrockets. It is generally desirable to pack logic within smaller and smaller spaces. This, however, must be balanced by an optimization of cost/part. Chips can be fabricated and packaged singly (single chip modules or SCMs) or with multiple chips attached to a common substrate (multi-chip modules or MCMs). Placing more electronics onto a single substrate produces shorter length electrical paths which is desirable from the standpoint of designing a computer. Shorter path lengths lessen timing problems for various signals.

Even though great strides have been made in packing more and more electronics and chips onto one substrate, the modules are still part of a multilevel interconnect system in most applications. Although MCMs are still not widely used and have not displaced other modules in some computer architectures, it is necessary to have many multiple chip modules and single chip modules in electrical communication with one another to effect an application capability to a system user. To achieve this, single chip modules and multiple chip modules are currently mounted onto a first printed circuit board. Several more of the many single chip modules and multiple chip modules are mounted onto a second printed circuit board. Similar to optimum yield-cost for integrated circuits, systems are optimally partitioned into printed circuit boards populated with appropriate chips. All the printed circuit boards are in turn connected to a back plane. The back plane is a planar board with a number of edge connectors thereon. Each edge type connector on the back plane grips the edge of a circuit board having multichip or single chip modules thereon. The edge connectors of the back plane receive the edges of the circuit boards. The back plane typically provides a connection to the data bus and command bus of the computer. The back plane could itself be another circuit board having edge type connectors connected to yet another back plane. In addition, in some systems single or multi-chip modules are mounted on the back plane(s) themselves.

The problem with such a system is that when a signal must pass from one module on a first printed circuit board to another module on a second circuit board, the signal path length becomes long, thereby limiting propagation speed. This is especially pronounced in a supercomputer environment where large amounts of data or commands are being moved from one module to another module. Each time the signal passes from one level of packaging to another level of packaging, such as from the printed circuit board to the back plane, the signal is also slowed down since the electrical path will be longer.

Other problems limit the capability of such a system. Increasing the number of interconnects, reduces the reliability of the system, particularly when 'hard attaches' (such as commonly used BGA or CGA) interconnect materials having different coefficients of thermal expansion (such as SCM or MCM substrates connected to printed circuit boards). Also, the current system of mounting the modules on printed circuit boards and then, in turn, mounting the printed circuit boards to a back plane uses a large amount of space. In addition, such systems are also difficult to cool.

There is a need for a system and method to overcome many of these current problems. A system and method needs to provide space savings and shorter path lengths. Such a method and system would reduce timing problems that result from delayed signals. The system and method should cut down on the number of layers necessary to interconnect a number of multiple module chips or single module chips. The system should also be easy to assemble and provide for good electrical contact to be made. In addition, the system and method should provide access to the individual modules and provide adequate access for cooling the individual modules as it is required from the designer's standpoint.

SUMMARY OF THE INVENTION

A system and method for electrically connecting one or more chip modules to a circuit board includes at least one chip module and flexible circuits connected to the electrical contact locations on the chip module. Each flexible circuit extends beyond the edge of the chip-connect area and forms a flap. The chip-connect area can be comprised of flexible isolation layers and metal layers. The chip-connect area can also be implemented in a ceramic substrate and then, in turn, hard-attached to an underlying flex. The substrate with flexible flaps is also referred to as superflex within this document. The flexible circuit attached to each chip includes electrical paths to pads on the flap of the flexible circuit. The pads on the flap of the flexible circuit are connected to corresponding pads on a printed circuit board. The printed circuit board is side mounted with respect to chip modules.

When the superflex includes a chip-connect area that has metallized layers separated by flexible isolation layers, the solution is essentially chip-on-flex. Such a solution eliminates another level of packaging and increases the reliability of the resulting system. In this application, there are generally multiple metallized layers used for carrying signals, ground planes and other purposes. Multiple metallized layers separated by flexible isolation layers produce a chip-connect area which is stiffer than the flexible flaps connected to the chip-connect area. The circuit module having a chip-connect area of multiple metallized layers and alternating flexible isolation layers has been named superflex.

Both a first and a second superflex have a flap extending beyond the edge of the respective superflex. Each flap portion of the flexible circuit has a set of pads. The pads on the flaps of the first and second superflexes are positioned to connect to a third set of pads on a printed circuit board. The printed circuit board is provided with pads positioned so that the pads on the flaps will correspond to the pads on the flaps of the superflexes. The circuit board is positioned near the edge of the first superflex and the second superflex so that the flaps of the first and second flexible circuit contact the third set of pads on said circuit board.

The first and second superflexes having flexible circuit flaps can be stacked on one another to provide a very densely packaged unit. If cooling is a concern thermally conducting surfaces can also be stacked with the superflex circuits. The thermally conductive surfaces can be heat pipes or thermally conductive substrates on the flat surface of the superflex circuit which conduct heat away from the chip.

Each superflex can also have more than one flap. For example, a superflex with four sides could have a flap which extends beyond the footprint of each edge of the chip-connect area of the superflex. Four printed circuit boards could be held in position around the chip. The four circuit boards would have pads thereon in a pattern that corresponds to the pads on the flaps along one edge of all the chips that will be stacked therein. A solder less attachment mechanism would hold the pads on the flaps onto the printed circuit boards. If three edges of the chip-connect area of the superflex are provided with flaps, better access to the attachment areas would be available. It is also contemplated that the superflex circuit could hold more than one chip module.

According to another alternate implementation of the present invention, both a first and a second ceramic substrate have a flexible circuit with a flap extending beyond the edge of the substrate. Each flap portion of the flexible circuit or superflex has a set of pads. The pads on the flaps of the first and second superflex are positioned to connect to a third set of pads on a printed circuit board. The printed circuit board is provided with pads positioned so that the pads on the flaps will correspond to the pads on the flaps of the superflex chips. The circuit board is positioned near the edge of the first superflex or ceramic substrate and the second superflex or ceramic substrate so that the flaps of the first and second flexible circuit contact the third set of pads on said circuit board.

The first and second superflex substrates having flexible circuit flaps can be stacked on one another to provide a very densely packaged unit. If cooling is a concern thermally conducting surfaces can also be stacked with the superflex substrates. The thermally conductive surfaces can be heat pipes or surface treatments on the flat surface of the chip which conduct heat away from the chip.

Each ceramic superflex can also have more than one flap. For example, a four-sided superflex could have a flap which extends beyond the footprint of each edge of the chip-connect area. Four printed circuit boards could be held in position around the superflex. The four circuit boards would have pads thereon in a pattern that corresponds to the pads on the flaps along one edge of all the chips that will be stacked therein. A solder less attachment mechanism would hold the pads on the flaps onto the printed circuit board. If three edges are provided with flaps on a four sided chip, better access to the attachment areas would be available. It is also contemplated that the flex circuit would hold multiple chips in a stacked fashion.

Advantageously, this invention provides an extremely tight package which provides for placing a large amount of computing power into a small amount of space. In addition, one interconnect level of past solutions, namely from the printed circuit board to the back plane, is eliminated with this solution. This provides for shorter signal paths for data requests and commands which lessen timing problems for a computer that must handle large amounts of data and commands in order to operate. The system is also easy to assemble, provides for good electrical contact, and provides access to the individual modules. Cooling using thermal conductive layers can also be easily accomplished by adding heat pipes or other conductive layers to the stacked ceramic substrates.

This invention also eliminates packaging and interconnect levels which lowers the per unit cost of performance. Eliminating packaging and interconnect levels also results in a much more reliable system. The resulting system also features reduced size and weight. In addition, less power may be needed which means less heat is generated.

DESCRIPTION OF THE PREFERRED EMBODIMENT

In the following detailed description of the preferred embodiment, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 10:
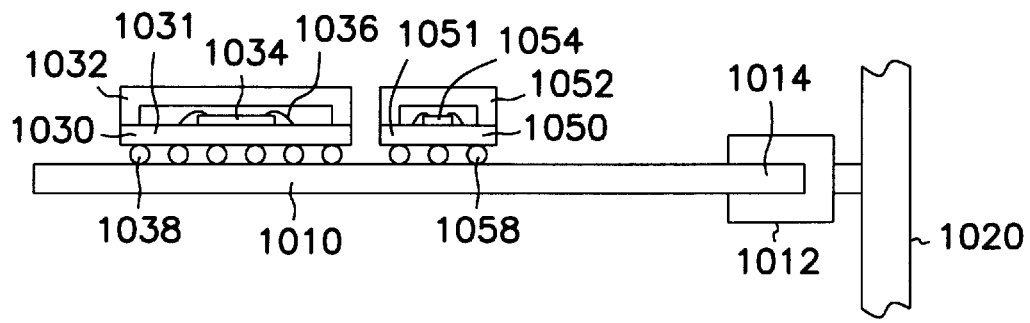
FIG. 10 is a cross-sectional view of a typical system having components attached to a printed circuit board and the printed circuit board attached to a back plane.

FIG. 10 shows the prior art arrangement where a printed circuit board 1010 is attached to a back panel 1020 by use of an edge connector 1012 which grips the edge 1014 of the printed circuit board 1010. The edge 1014 of the printed circuit board fits within the edge connector 1012. The edge connector 1012 includes electrical connections to the back panel 1020. The back panel includes electrical paths to a host computer or processor. The back panel 1020 is the hardware that is used to form the data and command bus. Mounted on the printed circuit board 1010 are a pair of electrical components. The first electrical component 1030 is a ball grid array type component that includes a substrate 1031 which is attached to the printed circuit board 1010 with balls 1038. A cap 1032 fits over the substrate 1031 and encapsulates a chip 1034. The chip 1034 is attached to the substrate 1030 by a wire bond 1036. The second component 1050 includes a substrate 1051 which is attached to the printed circuit board 1010 via balls 1058. An electrical component 1054 which is known as a flip chip is attached to the substrate 1051. The flip chip 1054 has an electrical connection on two surfaces of the chip 1054. The printed circuit board 1010 includes electrical conductor paths (not shown) which lead to the edge 1014 of the printed circuit board. The edge 1014 includes output portions which interact with the edge connector 1012.

The component attachment system of FIG. 10 has many problems. Among the problems are that there are several layers of interconnection that must be performed accurately. If the interconnection is not done correctly, reliability of the system will suffer. For example, there are several layers of packaging and connecting that must be accomplished in the system shown in FIG. 10. The edge connector 1012 must be attached appropriately to the back panel 1020. The edge 1014 of the printed circuit board must also be attached correctly to the edge connector 1012. The ball grid arrays of first component 1030 and second component 1050 each must be correctly attached to the printed circuit board 1010. In addition, for the first component 1030, the electrical component 1034 must be attached to the substrate via wire bonds 1036 and the cap 1032 must be correctly attached to the substrate 1031. Similarly, for the second chip 1050, the flip chip 1054 must be correctly attached to the substrate 1051 and the cap 1052 must also be attached to the substrate 1050. In essence, there are many levels of connection that must be successfully accomplished in order to have a system that will pass signals to and from the chips 1030 and 1050. Each layer or level of packaging or of connection affects the cost as well as the reliability of the system. With less levels of connection required, the reliability of the system will be enhanced. In addition, when attaching a ball grid array or a pin grid array, thermal cycling is another problem that can lessen the reliability of the system. For example, when the computer housing rises from room temperature to an operating temperature, the printed circuit board 1010 expands at a different rate than the chip 1030. This produces stresses between the chip 1030 and the printed circuit board 1010. These stresses occur every time there is a thermal cycle.

FIGS. 2-9 and 11-14 show several preferred embodiments which provide a solution to the problems of the prior art system shown in FIG. 10. The solution is to include flexible flaps outside of a chip-connect area which are used to connect directly to one of several back panels. In one preferred embodiment, a multi-chip module is provided with flexible flaps along at least one of its peripheral edges and preferably along at least three of its peripheral edges. The peripheral flaps are attached to one or more printed circuit boards which are positioned transverse to the multi-chip module and have electrical connection points which correspond to the pads on the flaps. In another preferred embodiment, the chip-connect area is comprised of multiple metal layers isolated from one another by flexible layers interposed between the metal layers. The end result is a chip-connect area which is somewhat flexible although still rigid since there are multiple metallized layers. A single metallized layer covered with a flexible isolation layer forms a flap at the outside edges of the chip-connect area. This approach is essentially chip on flex and has been called superflex in this application. Both of these solutions eliminate levels of packaging and interconnection when compared to the prior art solution illustrated in FIG. 10 and therefore, enhance the reliability of the computing system. The superflex solution eliminates more levels of packaging and interconnection than the multi-chip module or single chip module having flexible flaps. With this brief overview, the details of the preferred embodiments will now be discussed with respect to the figures.

Figure 1:
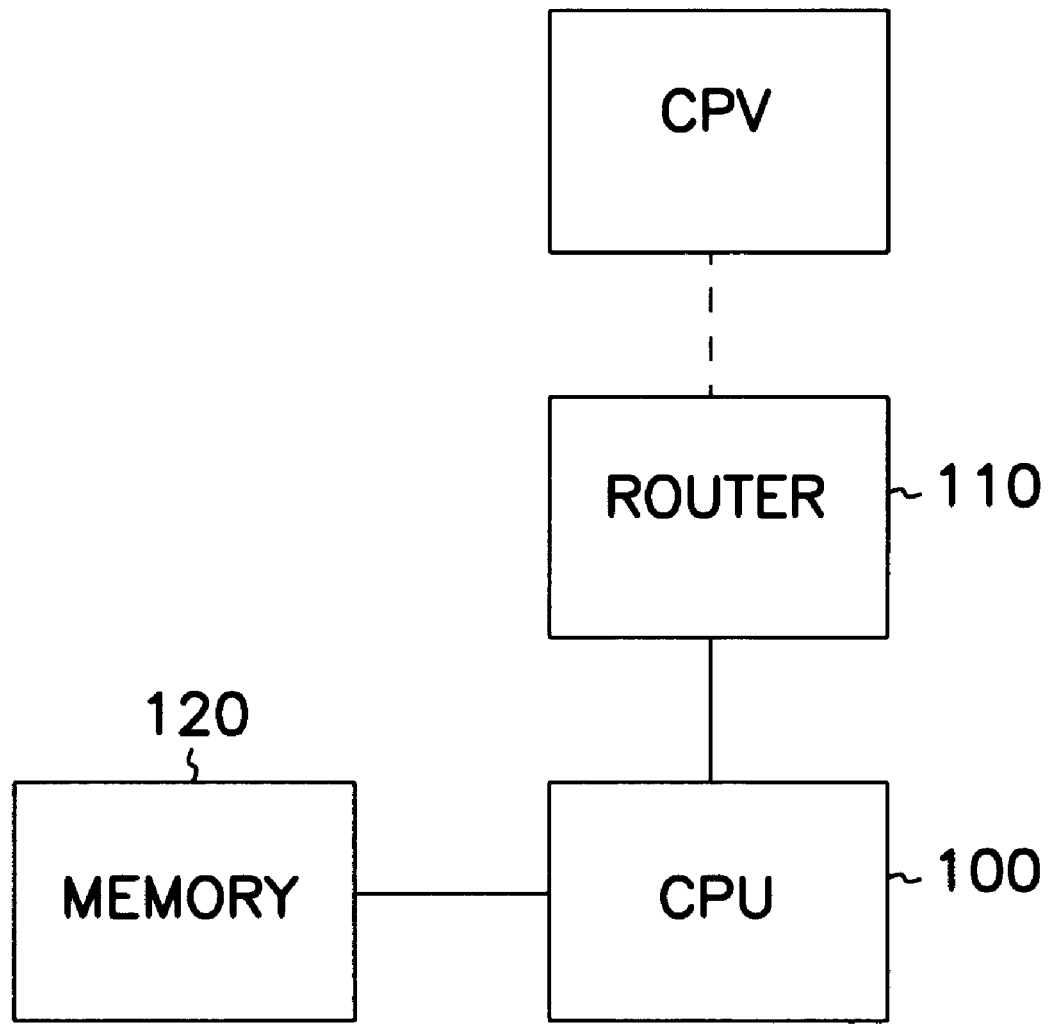
FIG. 1 is a block drawing of memory, and input/output router and a CPU.
Figure 5:
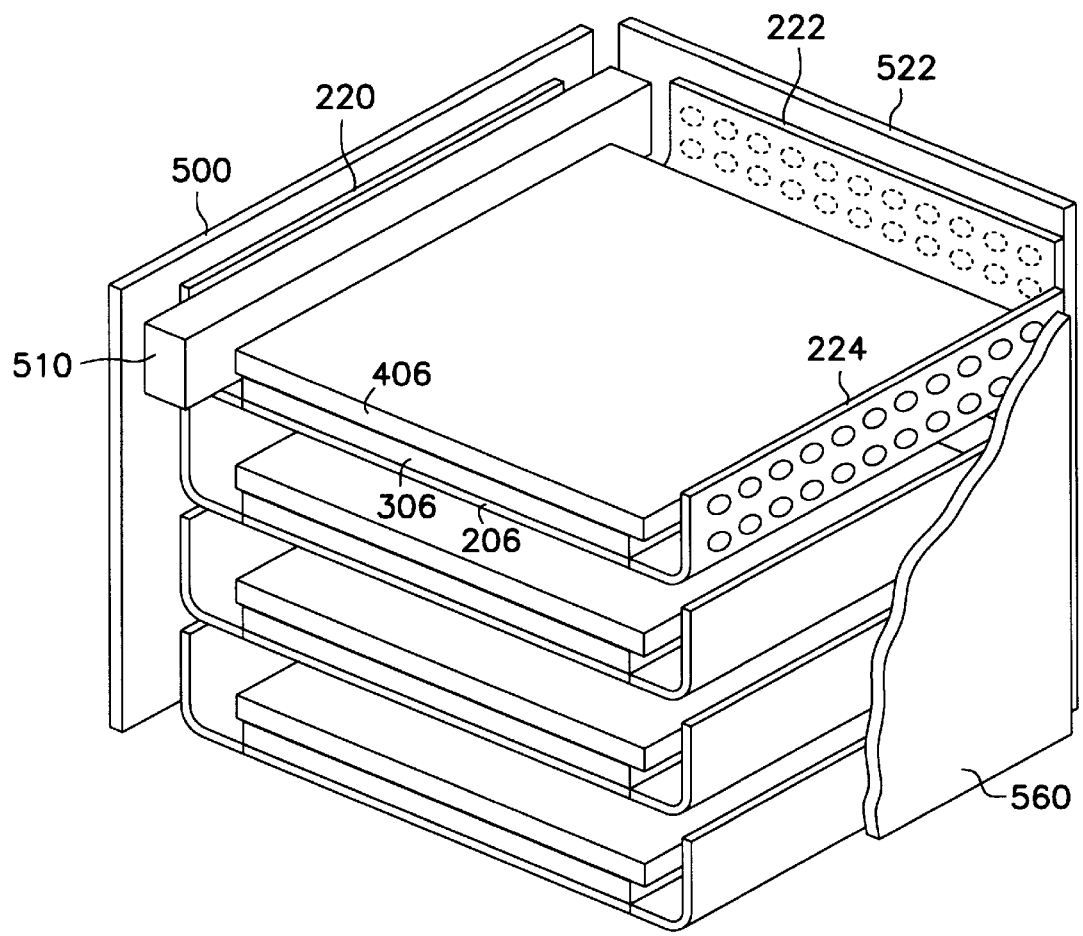
FIG. 5 is an isometric drawing of a stack of chips attached to a printed circuit board with a clamp.
Figure 6:
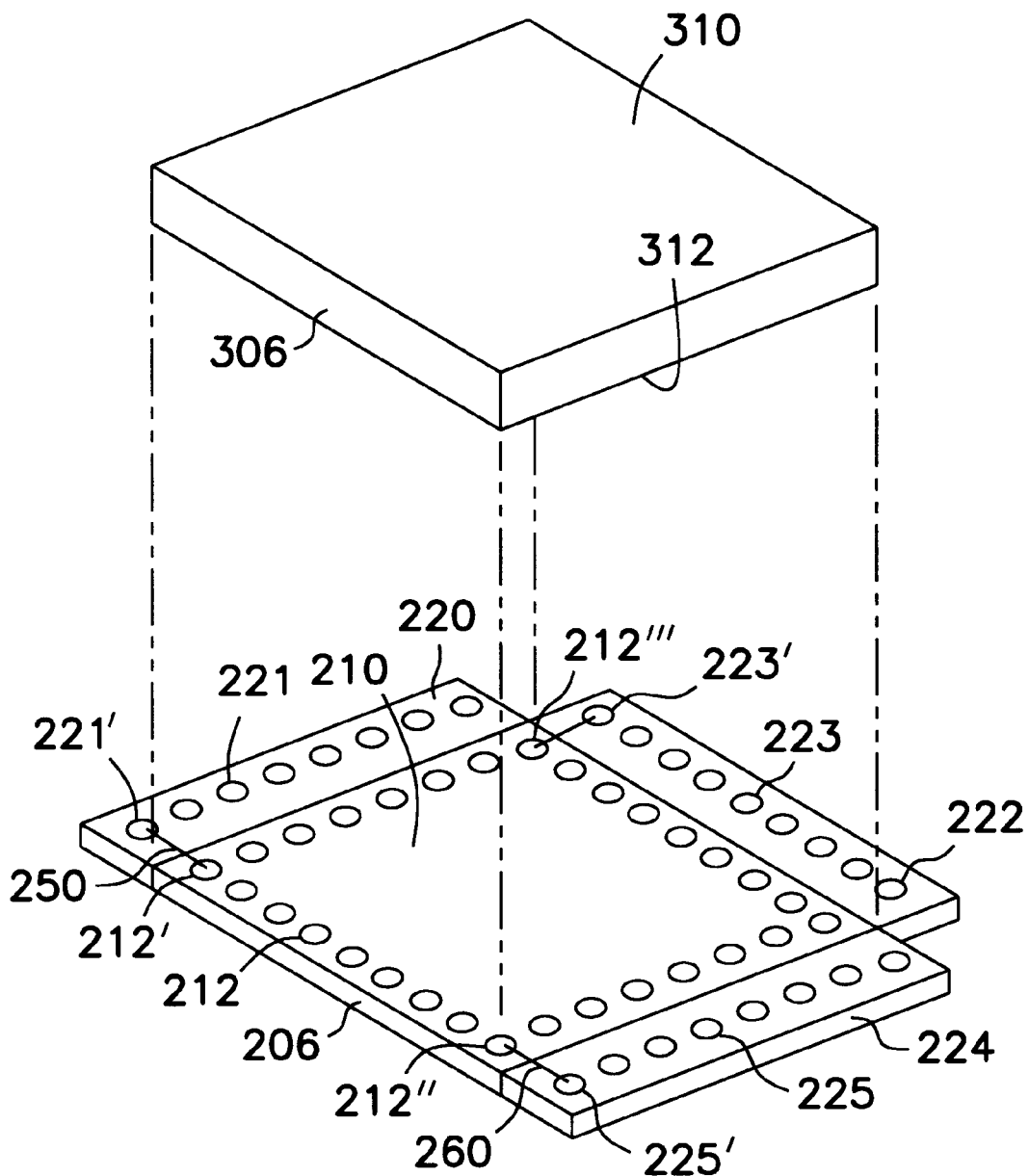
FIG. 6 is an exploded isometric drawing of a substrate having a flexible circuit attached thereto.
Figure 7:
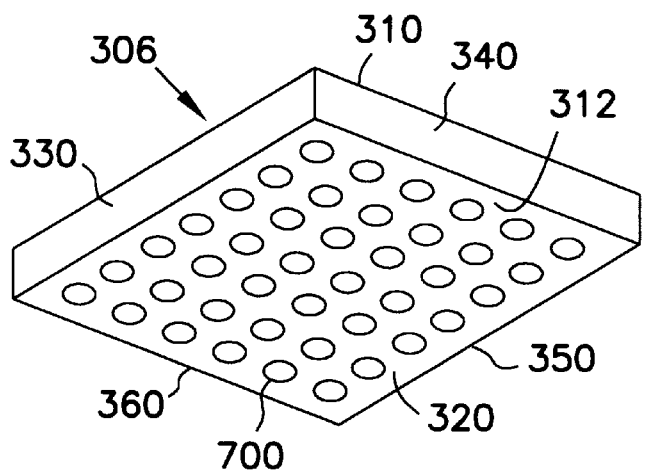
FIG. 7 is a bottom perspective view of a grid array type chip.

FIG. 1 is a block drawing of a computing unit. The typical computing unit has a processing unit 100, an I/O or input output router 110 and a memory 120. Each of the processing unit 100, the I/O router 110 and the memory 120 can be comprised of one or more ceramic substrates or chips. The chips can be packaged as single chip modules or multi-chip modules. Described below is a system and method for packaging the chips necessary for such a computing unit. A fully configured computing unit is comprised of several single chip or multi-chip modules placed in a compact space. FIG. 5 shows a complete computing unit. The complete computing unit is comprised of a number of individual chip modules. FIGS. 6 and 7 show an individual chip module which will be discussed initially.

The individual chip module shown in FIG. 6 is a building block for a complete computing unit. FIG. 6 is an exploded isometric view of a single chip and flexible circuit combination. FIG. 6 shows a single flexible circuit 206 that has flaps 220, 222 and 224. There are several lines on FIG. 6 that merely illustrate the approximate area where a flat portion 210 of the flex circuit ends and where the flaps begin. The lines also correspond to the footprint of a chip module 306. The flexible circuit has a flat portion 210 that has a plurality of electrical contact pads 212. The pads 212 correspond to the electrical contact pads on the surface of a chip module 306. Chip module 306 has an array of electrical pads 700, as shown in FIG. 7. The array of pads 700 is typical of land grid array chip modules or ball grid array modules which can now be found on the market.

The flap 220 has a number of pads 221, the flap 222 has a number of pads 222, and the flap 224 has a number of pads 225. The pads on the flaps are electrically connected to pads on the flat portion 210 of the flexible circuit. For example, pad 212' is attached to pad 221' via connection path 250 and pad 212" is attached to pad 225' via conductor path 260. Pad 212''' is also shown attached to pad 223' in FIG. 6.

Figure 8:
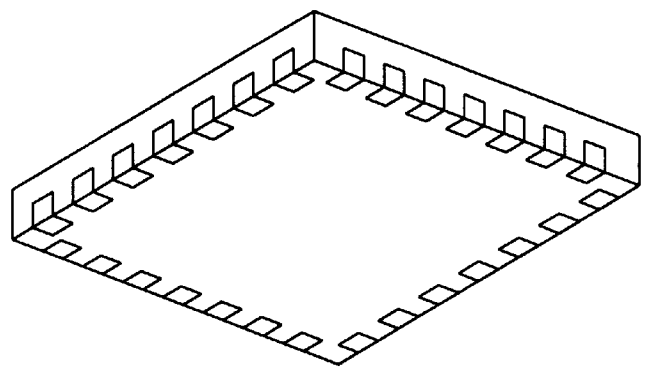
FIG. 8 is a bottom perspective view of a flip chip.

The pads on the flexible circuit 206 can be changed to any corresponding pattern of pads on the circuit module 306. This arrangement is not limited to pads on array type chips. For example, as shown in FIG. 8, flip chips that have electrical contact pads on the flat surface as well as the edge of a chip could have a flexible circuit attached thereto.

The flexible circuits can then be attached to a chip module, such as 306 by solder bath or other conventional means to form a flexible circuit and chip module combination. The flexible circuit 206 can be attached to chip module 306 in any of a number of ways. For example, the pads 212 on the flexible circuit 206 can be soldered to the pads on the surface 320 of the chip 306, thereby forming a hard attachment of the flexible circuit to the chip 306. The flexible circuit 206 can also be adhesively attached to the chip 306. Yet another option is to have a compliant attachment between the flexible circuit 206 and the chip 306. The individual flexible circuit and chip modules can be stacked or otherwise packed together as shown in FIGS. 2-5.

In FIGS. 2-5, the individual chips are stacked to "build up" a computing module. These figures are provided for ease of illustration. These figures show a progressive build up of a computing module.

Figure 2:
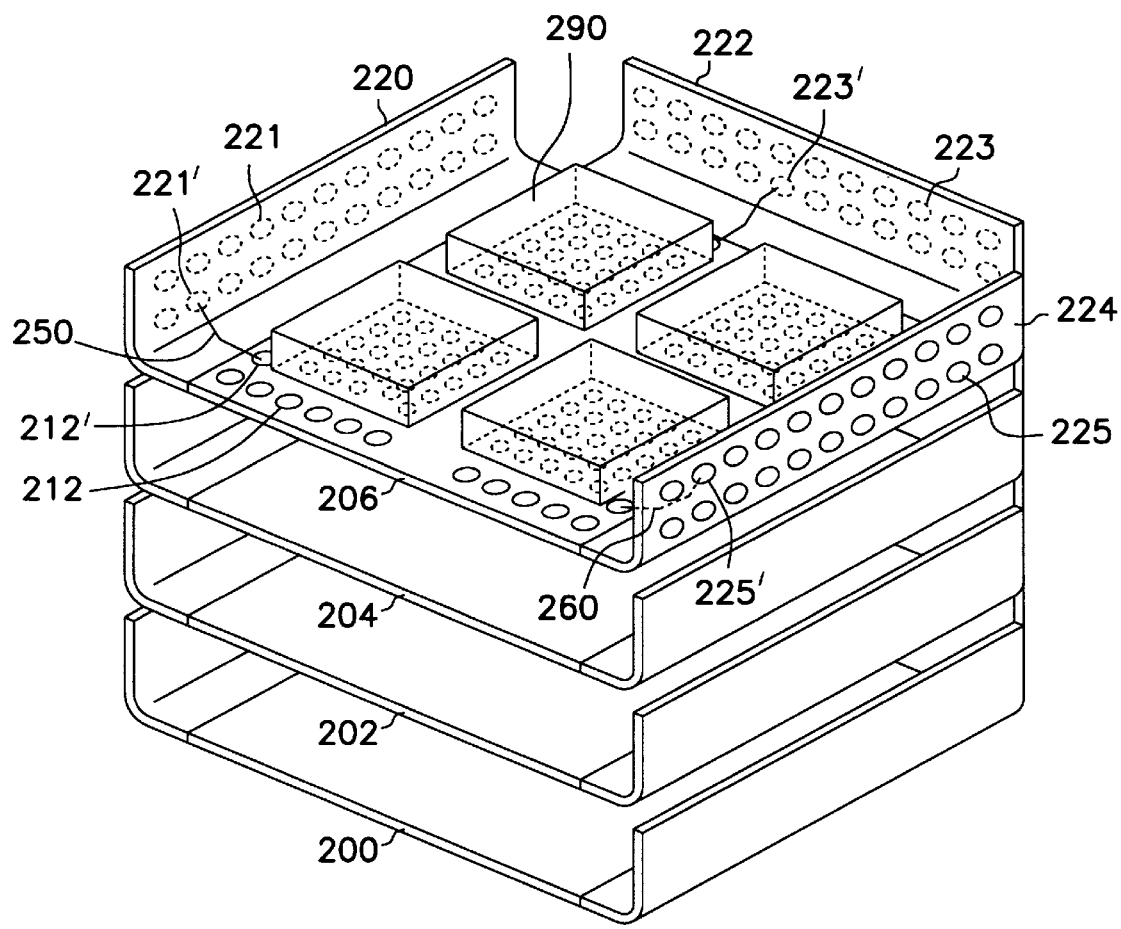
FIG. 2 is an isometric drawing of several flexible circuits which would attach to substrates in one preferred embodiment of the invention.

FIG. 2 shows an isometric drawing of flexible circuits 200, 202, 204 and 206. Each of the flexible circuits 200, 202, 204 and 206 are comprised of a flat portion 210 and a first flap 220, a second flap 222, and a third flap 224. Each of the flaps 220, 222 and 224 are attached to the edge of the flat portion 210 of the flexible circuit. Flexible circuit 206 is the flexible circuit most easily seen in FIG. 2 and therefor the flaps 220, 222 and 224 are numbered for that particular flex circuit. It should be understood that the other flexible circuits 200, 202 and 204 also have similar flaps. The flat portion 210 of the flex circuit 206 includes a multiplicity of electrical contact locations or pads 212. The locations of the pads 212 correspond to like pads on a die or chip module 290 which is attached to the flat portion or chip interconnect region 210. Similarly, the flap 224 has a plurality of electrical pads 225 located on the flap 224. The second flap 222 has a plurality of pads 223 also located on the second flap. The first flap 220 has a plurality of pads 221 which are located on the first flap 220. As can be seen, the flat portion 221 remains flat, while the flaps 220, 222 and 224 are bent with respect to the flat portion of the flexible portion. In one embodiment, the ends of the flaps 220, 222 and 224 are roughly perpendicular to the flat portion 210 of the flex circuit 206. It should be noted that the flaps 220, 222 and 224 do not necessarily have to be at a perpendicular angle with respect to the flat portion 210 of the flex circuit 206.

Figure 3:
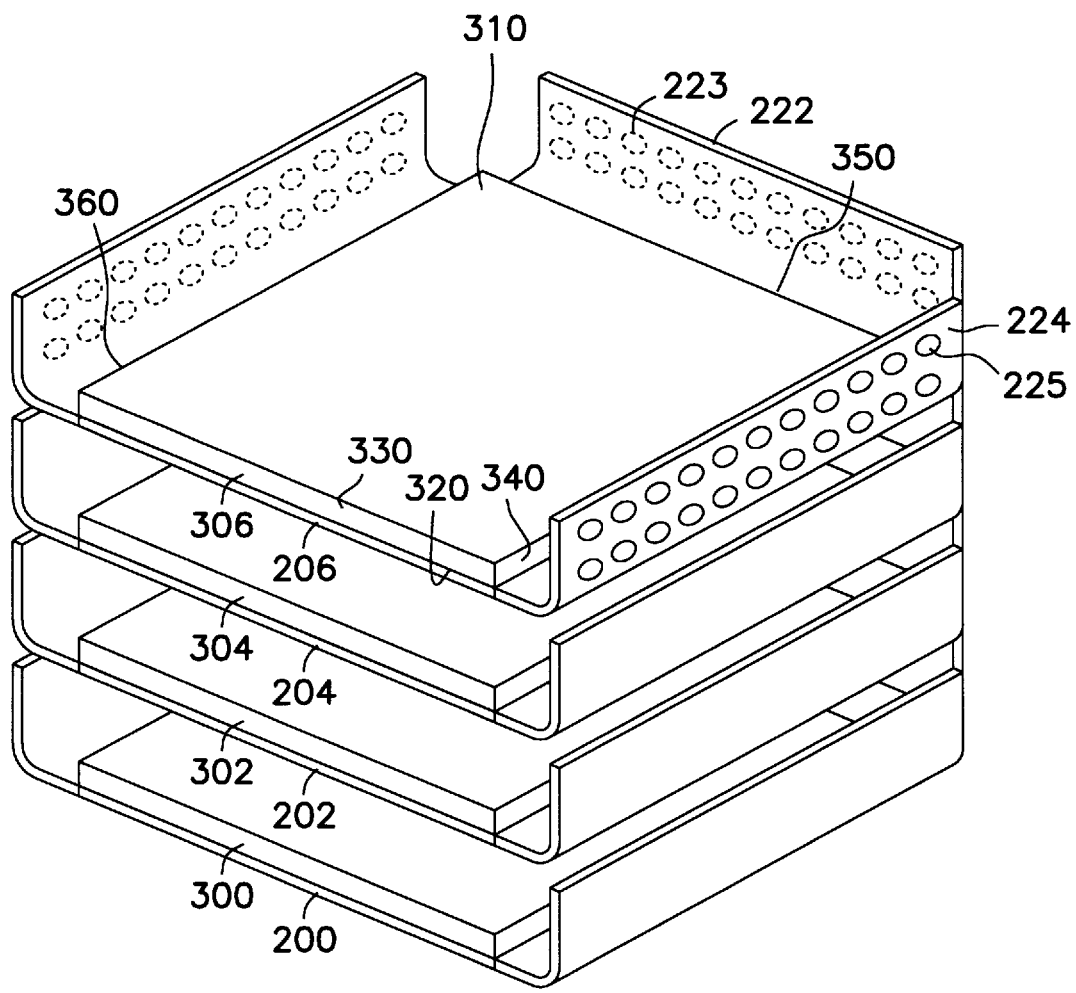
FIG. 3 is an isometric drawing of several chips with flexible circuits attached to ceramic substrates.

FIG. 3 is an isometric drawing of the flexible circuits 200, 202, 204 and 206 shown in FIG. 2, but with additional ceramic substrates added to the flex circuits. In FIG. 3, a chip module 300 has been added to the flex circuit 200. A chip module 302 has been added to the flex circuit 202. A chip module 304 has been added to the flex circuit 204 and a chip module 306 has been added to the flex circuit 206. Chip modules 300, 302, 304 and 306 could be SCMs, MCMs or any combination thereof. Chip modules could also be flip chips. In one embodiment, each chip module 300, 302, 304 and 306 is essentially the same in terms of its external geometry. Therefore, applicant will describe one of these chip modules (e.g., chip module 306) rather than describe all four modules. As shown in FIGS. 3, 6 and 7, chip module 306 has two rather large planar surfaces, a first planar surface 310 and a second planar surface 320. Chip module 306 has a foot print which is the area of one of the surfaces 310 or 320. Chip module 306 also has four edges 330, 340, 350 and 360. The first flap 220 extends beyond the edge 360. The second flap 222 extends beyond the edge 350. The third flap 224 extends beyond the edge 340. In the particular example shown, there is no flap that extends beyond the edge 330 of the chip module 306.

Chip module 306 includes a plurality of pads or electrical contact locations (not shown) on the surface 320 of the chip 306. The pads or electrical contact locations on chip module 306 are arranged in an array or pattern on the surface 320 of the chip. In one embodiment, chip module 306 is a ceramic or plastic package such as a flip chip or a grid array chip. In one such embodiment, the electrical contact locations or pads are flat lands. The array of electrical contact locations on the surface 320 corresponds to the array of pads 212 on the flat surface 210 of the flexible circuit 206. The pads on the flexible circuit 212 therefor make electrical contact and are attached to the pads (shown in FIG. 7) on surface 320 of the chip module 306. The flexible circuit 206 can be attached to chip module 306 in any of a number of ways. For example, the pads 212 on the flexible circuit 206 can be soldered to the pads on the surface 320 of the chip 306, thereby forming a hard attachment of the flexible circuit to the chip 306. The flexible circuit 206 can also be adhesively attached to the chip 306. Yet another option is to have a compliant attachment between the flexible circuit 206 and the chip 306. Now turning backward briefly to FIG. 2, it can be seen that each of the pads 212 on the flat portion 210 of the flex circuit 206 has an electrical path to one of the pads on one of the flaps. For example, the pad 212' is connected to pad 221' by an electrical conductor 250. Similarly, a pad 212" is attached to pad 225' on the third flat 224 by an electrical conductor 260. Each of the pads 212 on the flat portion of the flexible circuit 206 is attached to a corresponding pad on one of the flaps; namely either the first 220, the second flap 222 or the third flap 224. Thus, by attaching the flexible circuit 206 to the surface 220 of chip module 306, the pads on the surface 320 have been extended out, if you will, to pads on one of the three flaps.

Each of the chips is independent from one another. It should be understood that the flexible circuits 200, 202, 204 and 206 are not connected to one another, but are merely shown as a stack of four for the purposes of this example. More than four chip modules could be stacked to form a computing unit. Less could also be used.

Figure 4:
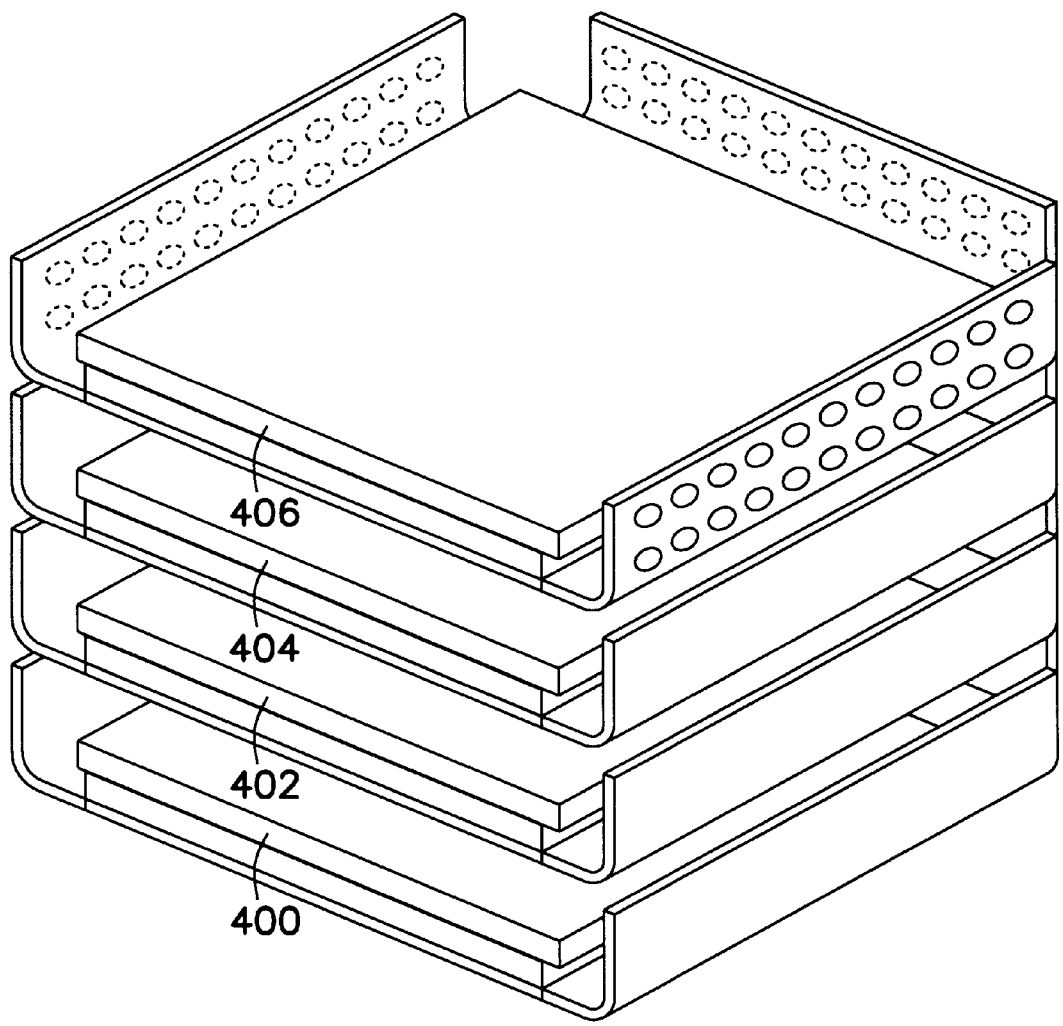
FIG. 4 is an isometric drawing of several integrated circuit chips with flexible circuits attached to ceramic substrates and having thermal planes of conductive material.

FIG. 4 shows an isometric view which includes thermally conductive planes being attached to each of chip modules 300, 302, 304 and 306. In one such embodiment, chip modules 300, 302, 304 and 306 are ceramic packages to better conduct heat from the integrated circuits. As shown in FIG. 4, thermal conductive plane 400 is attached to ceramic chip module 300, thermal conducting plane 402 is attached to chip module 302, thermal conducting plane 404 is attached to chip module 304 and thermal conducting plane 406 is attached to the chip module 306. The thermally conducting planes 400, 402, 404 and 406 conduct heat away from the chip modules 300, 302, 304 and 306, respectively. The thermal planes are highly conductive materials, such as aluminum nitride, beryllium oxide, cubic boron nitride, diamond or heat pipes. The thermal planes remove heat from each layer and they are either hard attached to the respective chip or are pressed against the chip using a compliant backing layer. In this case, the chip modules and their respective thermal planes would be stacked adjacent one another and a compression force would be added to the stack to press the thermal planes 400, 402, 404 and 406 against chip modules 300, 302, 304 and 306, respectively.

FIG. 5 shows an isometric drawing of a stack of chips attached to a printed circuit board 500. Also shown in FIG. 5 are a printed circuit board 522, and a printed circuit board 560. Again, like with the previous drawings, the flexible circuit 206 attached to the ceramic chip 306 which carries the thermally conductive layer 406 will be described, since it is most easily seen as it is on top of the figure. The other chips are substantially the same and so, rather than repeat the description, the description will merely describe the top chip and the description will be applicable to the remaining chips. Printed circuit board 500 has a plurality of pads 502 which are arranged along the surface of the circuit board 500. The pads 502 on the surface of the circuit board 500 are arranged so that they correspond to the pads 221 on the first flap 220 of the flexible circuit 206. Similarly, there are other pads 502 on the surface of the circuit board 500 which correspond to the flaps of the flex circuit which touch the circuit board 500. There are also pads 522 on the circuit board 520 which correspond to the pads 223 on the second flap 222 of the flexible circuit 206. Similarly, there are pads 522 on the circuit board 520 which are arranged to contact the pads of the similarly positioned flaps on the flex circuits 200, 202 and 204. Printed circuit board 560 also has pads which are arranged to receive or connect to the pad 225 on the third flap 224 of the flex circuit 206. Similarly, there are pads 562 on the circuit board 560 which are arranged to contact all the similarly positioned flaps on the flex circuit 200, 202 and 204. In this particular figure, circuit board 560 is shown as broken away so as to ease the illustration of this invention. A clamp 510 is used to place a force on the first flap 220 of the flexible circuit 206. The clamp 510 provides a force to assure that a good electrical contact has been made between the pads 221 on the first flap 220 and the corresponding pad 502 on the printed circuit board 500. Although only one clamp 510 is shown in FIG. 5, a clamp such as 510 could be used for each flap that is in the stack of chips 300, 302, 304 and 306. It should be noted that any of the pads in the invention can be specialty treated to enhance the electrical contact capability of that pad. For example, the pads could be provided with small dendrites so that one pad would be more able to make a good electrical contact by piercing the oxide layer on another pad. Similarly, particles could be provided on one pad and then the particles could be sputtered with a tough metal so that the over coated particles would brake the oxide of the other pad.

Figure 9:
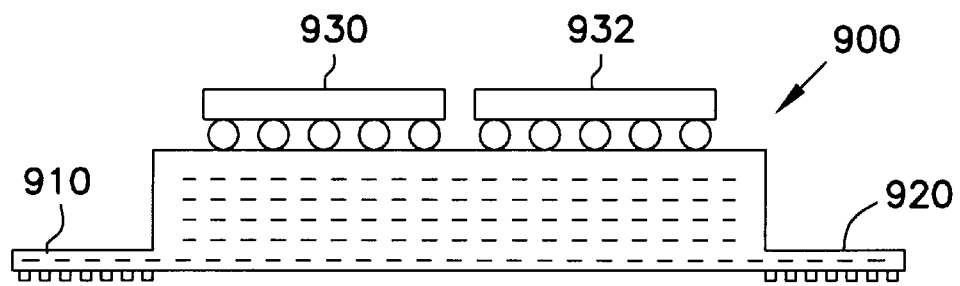
FIG. 9 is a second embodiment of the chip used in this invention.

FIG. 9 is a second embodiment of the chip used in this invention. In this case the flexible circuit is formed as one of the layers of the superflex 900. As shown in FIG. 9, the flexible circuit emerges from the bottom edge of the super flax carrier 900. The flexible flap or superflex tabs 910, 920 emerge from an edge of the chip. It can be seen that this type of carrier could be easily stacked just like the MCMs and SCMs with the flex circuit attached or electrically connected to the bottom flat surface of the MCM or SCM. As shown in FIG. 9, dies 930 and 932 are attached to the die or chip interconnect area of the superflex carrier 900. The dies 930, 932 shown use a ball grid array type interconnect system. The dies 930, 932 are added on one side of the chip-connect area of the superflex carrier 900. Dies may or may not be added on the opposite end of the superflex area. Pads used for I/O signals or passing power are provided on the superflex tabs positioned around the edge of the carrier 900.

As can be seen, each combination of a flexible circuit, chip, and thermal layer or plane can be separately assembled. Each separate combination thermal plane, circuit chip and flexible circuit can then be stacked and then the flaps can be clamped to the side interconnect printed circuit boards 500, 520, or 560. It is also contemplated that the flexible circuit could carry more than one chip module. Several chip modules may even populate one surface of the flex circuit.

Figure 11:
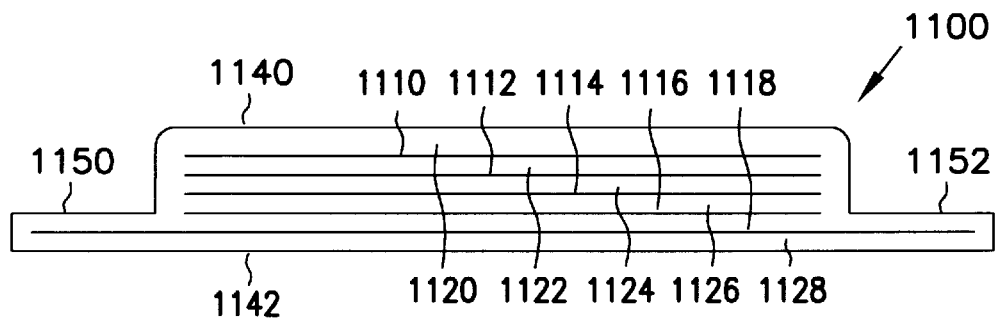
FIG. 11 is a cross-sectional view of a superflex.

FIG. 11 shows the superflex type of chip connector 1100. The superflex type chip connector 1100 is comprised of a plurality of metallized layers 1110, 1112, 1114, 1116 and 1118. Each of the metallized layers are separated by a flexible isolation layer 1120, 1122, 1124, 1126 and 1128. The end result is that a middle section is formed that is relatively thick and made up of a plurality of interchanged metallized layers and flexible isolation layers. This middle area has a surface called the chip-connect area 1140. A superflex type connector can also have a second chip-connect area or surface 1142 where chips can be connected. One of the metallized layers 1114 extends out beyond the thicker area between surface 1140 and surface 1142 and forms a single metallized layer 1114 surrounded by two isolation layers 1124 and 1126. These extended areas are also known as flaps 1150 and 1152. The flaps 1150 and 1152 contain or terminate in connection areas for making electrical connection between the flaps 1150 and 1152 and the metallized layers and the chip-connect areas 1140 and 1142. The flaps emerge from the bottom of the superflex type connector 1100 as shown in FIG. 11.

Figure 12:
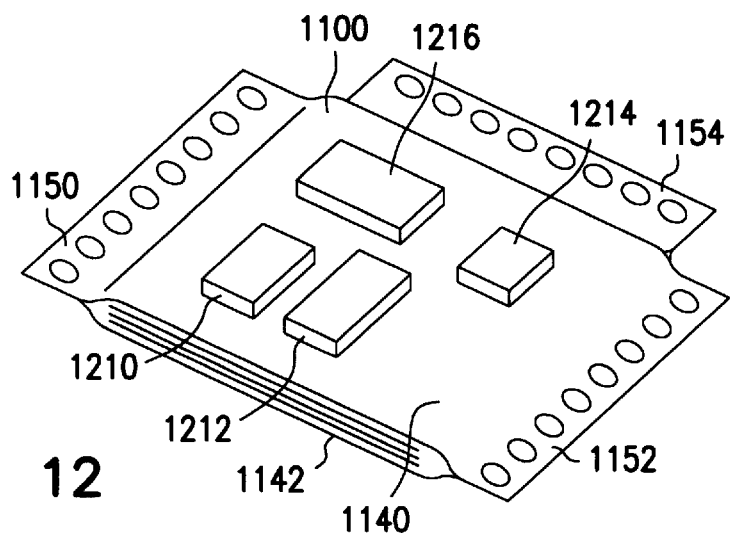
FIG. 12 is a top perspective view of a populated superflex.

FIG. 12 shows a perspective view of the superflex 1100. In FIG. 12, the superflex 1100 is populated with several discrete chips which have been numbered 1210, 1212, 1214 and 1216. The chips 1210, 1212, 1214 and 1216 are attached to the chip-connect area or surface 1140. Although not shown, the chip connect surface 1140 has contact areas so that the various components 1210, 1212, 1214 and 1216 can be electrically connected to the chip connect surface 1140. The chips attached to the chip connect surface 1140 can be any type of chip. Flip chips are shown in FIG. 8. Attaching the electrical components to the chip connect surface is essentially the same procedure as used to attach a chip on a flex cable or a flexible circuit. The advantage of this approach is that yet another level of packaging and interconnection is eliminated with components attached to the superflex 1100.

It should be noted that the portion of the superflex 1100 between the chip connect surface 1140 and the chip connect surface 1142 is somewhat rigid and also somewhat flexible. The chip-connect area is semi-rigid since there are more layers in the chip-connect area. There are less layers out to the flap area which makes the flaps flexible. The semi-rigid nature of the superflex 1100 allows it to be stacked in much the same way as the embodiment shown in FIGS. 2–9. It should be noted that in FIG. 12, flaps 1150, 1152 and 1154 emerge from the area of the superflex connector 1100 that is between the first chip connect surface 1140 and the second chip connector surface 1142.

Figure 13:
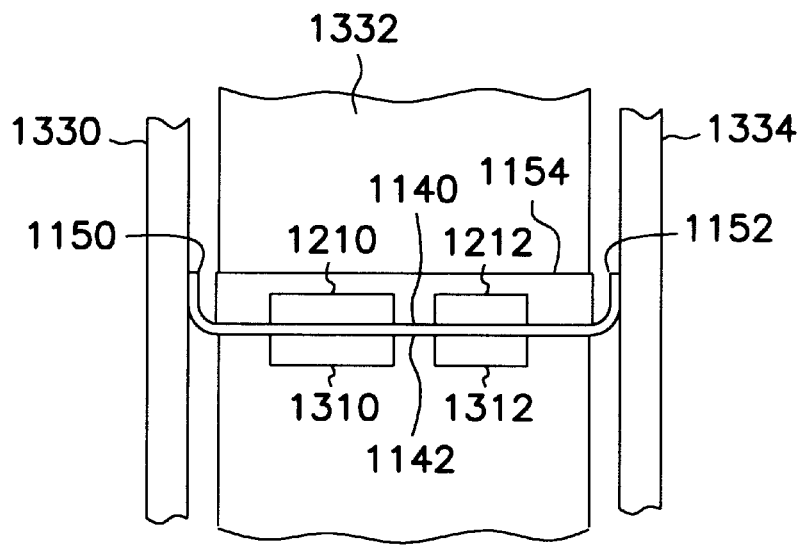
FIG. 13 shows a superflex attached to a plurality of printed circuit boards.

FIG. 13 shows the superflex 1100 populated with electrical components 1210 and 1212 on the chip-connect area 1140 and populated with electrical components 1310 and 1312 on chip connect surface 1142. The flaps 1150, 1152 and 1154 are upturned and contact printed circuit boards 1330, 1332 and 1334. The connection pads on the flaps 1150, 1152 and 1154 make electrical connection with corresponding areas on the printed circuit boards 1330, 1334, and 1332, respectively. A mechanical bar can be used to permanently place the flap into contact with the printed circuit board. The clamp is not shown in FIG. 13. The clamp would be similar to the clamp 510 shown in FIG. 5.

Figure 14:
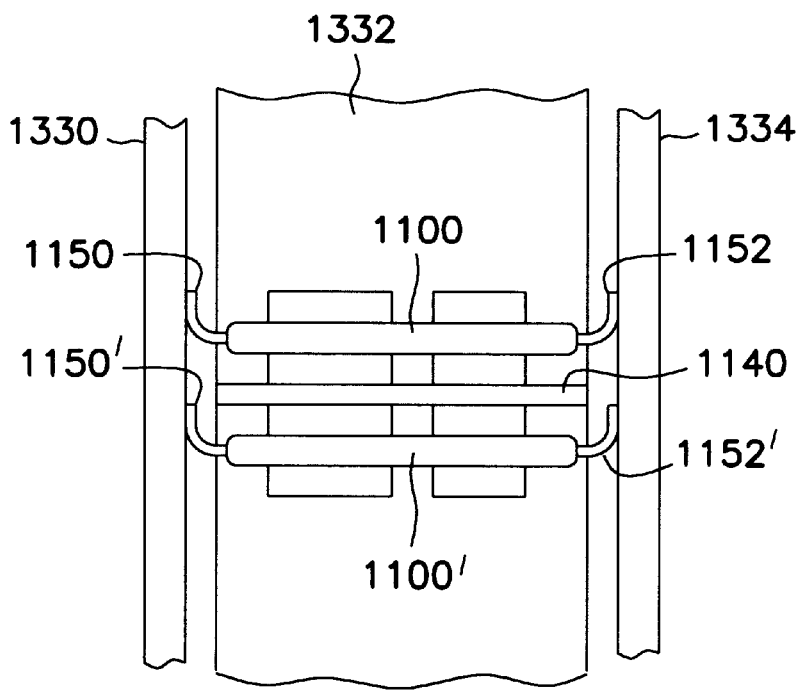
FIG. 14 shows a plurality of superflex forming a stack and attached to printed circuit boards.

FIG. 14 shows several superflex connectors 1100 and 1100', each having flaps 1150, 1152 and 1154 and 1150', 1152' and 1154' attached to printed circuit boards 1330, 1332 and 1334. A thermally conductive element 1140 is positioned between superflex 1100 and superflex 1100' in the stacked configuration. The thermal layer 1440 is sandwiched between 1100 and 1100'. The thermal conduction layer removes the heat from the components populating the superflex 1100 and the components populating the superflex 1100'. It should be noted that additional superflexes populated with electrical components can be added to form a vertical stack of superflex 1100 type connectors.

As can be seen, this system and method potentially eliminates interconnecting multilayer substrates and their respective attaches. Rather than having a chip attached to a printed circuit board and then into a back panel, the intermediate printed circuit board is eliminated. With the system and method shown, the printed circuit board is eliminated and the side interconnect boards are comparable to the system back panel. Another chief advantage of this invention is that the close distances enable lower signal latency and therefor enhance the capability of the system to operate at higher frequencies. In addition, the packaging is extremely tight. For example, seven layer stacks can be made which have two processing chips, two gigabytes of memory and an input-output router. The chip sets form a stack approximately 2.3 inches by 2.3 inches by 6 inches and have a total of several gigaflops (GFLOPS) using today's IC technology. Of course, higher memory capabilities may be available using future IC technology. This a space saving design which allows for shorter signal paths and decreased latency between the signals. The system can also be cooled using the thermal plane. The system can also be easily assembled.

In practice, the three printed circuit boards are held in a vertical position to form a U-shaped receiving set of pads. The individual assembled flex circuits, chips and thermal planes are then brought into place, positioned and clamped. This is done successively to form a vertical stack of chips. It should be noted that, if the design should warrant, the printed circuit boards do not necessarily have to be in a plane perpendicular to the flat surface of the chips.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A system for electrically connecting a plurality chips to a circuit board comprising:
    a first ceramic substrate having electrical contact locations, two planar surfaces, a first edge and a second edge;
    a first flexible circuit connected to the electrical contact locations of the first ceramic substrate, said first flexible circuit having a first flap extending beyond the first edge of the first ceramic substrate, said first flexible circuit having a second flap extending beyond the second edge of the first ceramic substrate, said flexible circuit having electrical paths to pads on the first and second flaps of the first flexible circuit;
    a second ceramic substrate having electrical contact locations, two planar surfaces a first edge and a second edge;
    a second flexible circuit connected to the electrical contact locations of the second ceramic substrate, said second flexible circuit having a first flap extending beyond the first edge of the second ceramic substrate, said second flexible circuit having a second flap extending beyond the second edge of the second ceramic substrate, said flexible circuit having electrical paths to pads on the first and the second flaps of the second flexible circuit; and
    a first circuit board and a second circuit board having a third set of pads positioned in electrical contact with the pads on the first and second flaps of the first flexible circuit and with the pads on the first and second flaps of the second flexible circuit.

2. The system for electrically connecting a plurality chips to a circuit board of claim 1 wherein the first substrate is stacked on the second substrate.

3. The system for electrically connecting a plurality chips to a circuit board of claim 1 wherein the first substrate and the second substrate each have a plurality of flaps emerging from said substrate.

4. The system for electrically connecting a plurality chips to a circuit board of claim 1 wherein a plurality of circuit boards are positioned near the flaps of the first substrate and the second substrate.

5. The system for electrically connecting a plurality chips to a circuit board of claim 1 wherein the first ceramic substrate is stacked on the second ceramic substrate.

6. The system for electrically connecting a plurality chips to a circuit board of claim 5, said system further comprising:
    a first thermally conductive layer contacting the first substrate; and
    a second thermally conductive layer contacting the second substrate.

7. The system for electrically connecting a plurality chips to a circuit board of claim 6 wherein one of the first thermally conductive layer or the second thermally conductive layer is a heat pipe.

8. A computing package comprising:
    a circuit having a substantially planar first portion, said first portion having a plurality of metallized layers and a plurality of isolation layers of a flexible material, said first portion having a chip-connect;
    a first flexible flap connected to the first portion of the circuit, said first flexible flap extending beyond the first edge of the first portion, said chip connect area having electrical paths to pads within the first flexible flap of the flexible circuit;
    a second flexible flap connected to the first portion of the circuit, said second flexible flap extending beyond the second edge of the first portion, said chip connect area having electrical paths to pads within the second flexible flap of the flexible circuit; and
    a printed circuit board having contact pads positioned substantially transverse to said first portion of the circuit, wherein the first and second flaps further include contact pads, said first and second flaps attached to the first portion of the circuit and positioned so the contact pads of the first and second flaps are in electrical contact with the contact pads on the printed circuit board, wherein the first portion of the circuit has at least one substantially straight edge, said printed circuit board positioned near the substantially straight edge of the first portion and wherein the first portion of the circuit has a plurality of substantially straight edges, further comprising a plurality of flaps emerging from some of said straight edges, a plurality of printed circuit boards portioned adjacent said straight edges, said printed circuit boards having contact pads, said printed circuit boards positioned so that the flaps having contact pads make electrical contact with contact pads on the printed circuit boards.

9. The computing package of claim 8 further comprising a plurality of computing packages stacked with respect to each other, said flaps of said computing packages making electrical contact with the printed circuit boards.

10. A system for electrically connecting a plurality chips to a circuit board comprising:
    a first substrate having a chip-connect area which has electrical contact locations, said first substrate having two substantially planar surfaces and an edge;
    a first chip attached to the chip connect area;
    a second chip attached to the chip connect area;
    a first flap emerging from said first substrate and extending beyond the edge of the first substrate, said flap having electrical paths at least some of the electrical contact locations on the first substrate;
    a second substrate having a chip-connect area which has electrical contact locations, two substantially planar surfaces and an edge;

a second flap emerging from said second substrate and extending beyond the edge of the second substrate, said second flap having electrical paths at least some of the electrical contact locations on the second substrate; and a circuit board having a third set of pads positioned for electrical contact with the first set of pads on the first flap and with the second set of pads on the second flap, said circuit board positioned near the edge of the first substrate and the second substrate so that the first set of pads on the first flap and the second set of pads on the second flap contact the third set of pads on said circuit board.

* * * * *

UNITED STATES PATENT AND TRADEMARK OFFICE
CERTIFICATE OF CORRECTION

PATENT NO. : 6,172,874 B1  
DATED : January 9, 2001  
INVENTOR(S) : Bradley W. Bartilson Page 1 of 1

It is certified that error appears in the above-identified patent and that said Letters Patent is hereby corrected as shown below:

<u>Column 6,</u>  
Line 41, delete "pads 222" and insert -- pads 223 --, therefor.

<u>Column 9,</u>  
Lines 27 and 28, delete "super flax" and insert -- superflex --, therefor.

<u>Column 10,</u>  
Line 50, delete "1440" and insert -- 1140 --, therefor.

Signed and Sealed this

Thirtieth Day of October, 2001

Attest:

Attesting Officer

NICHOLAS P. GODICI  
Acting Director of the United States Patent and Trademark Office